(12) United States Patent
Brun

(10) Patent No.: US 6,630,029 B2
(45) Date of Patent: Oct. 7, 2003

(54) FIBER COATING METHOD AND REACTOR

(75) Inventor: Milivoj Konstantin Brun, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 79 days.

(21) Appl. No.: 09/728,904

(22) Filed: Dec. 4, 2000

(65) Prior Publication Data

US 2002/0066409 A1 Jun. 6, 2002

(51) Int. Cl.$^7$ .............................. H01L 0/21; C03C 25/02
(52) U.S. Cl. ...................... 118/718; 118/715; 264/640; 427/163.2; 427/255.28; 427/178; 427/255.5; 65/418; 65/413; 65/529
(58) Field of Search ................................ 118/718, 725, 118/715, 722, 724; 156/345; 264/640; 427/163.2, 255.28, 178, 255.5; 65/418, 413, 529

(56) References Cited

U.S. PATENT DOCUMENTS

| | | | |
|---|---|---|---|
| 3,933,122 A | * | 1/1976 | Wagner ........................ 118/49 |
| 4,863,760 A | | 9/1989 | Schantz et al. |
| 4,976,761 A | | 12/1990 | Allaire |
| 5,146,869 A | * | 9/1992 | Bohannon et al. .......... 118/715 |
| 5,194,080 A | * | 3/1993 | Aikawa et al. ............. 118/718 |
| 5,250,243 A | | 10/1993 | Allaire et al. |
| 5,320,659 A | * | 6/1994 | Ishiguro et al. .......... 427/163.2 |
| 5,346,520 A | * | 9/1994 | Meabon et al. ............ 118/50.1 |
| 5,459,114 A | | 10/1995 | Kaya et al. |
| 5,682,594 A | | 10/1997 | Kennedy et al. |
| 5,695,830 A | | 12/1997 | Larnac et al. |
| 5,720,933 A | | 2/1998 | Srinivasan |

FOREIGN PATENT DOCUMENTS

JP 07206476 A * 8/1995 ........... C03C/25/02

* cited by examiner

Primary Examiner—Gregory Mills
Assistant Examiner—Ram N Kacar
(74) Attorney, Agent, or Firm—Toan P. Vo; Patrick K. Patnode

(57) ABSTRACT

In a method of coating a CMC fiber, the fiber is passed through a reaction zone along a path substantially parallel to a longitudinal axis of the zone, a flow of fiber coating reactant is passed though the reaction zone, at least a portion of the flow of reactant is disrupted from a path substantially parallel to the fiber path to create a mixing flow adjacent the fiber. A coating reactor includes a reactor chamber to accommodate a fiber passing along a path substantially parallel to a longitudinal axis of the chamber and a flow of fiber coating reactant. The reactor chamber further includes a flow disrupter located within the reactor chamber to disrupt at least a portion of the flow of reactant from a path substantially parallel to the fiber path to create a mixing flow adjacent the fiber.

1 Claim, 4 Drawing Sheets

FIBER COATING METHOD AND REACTOR

BACKGROUND OF THE INVENTION

The invention relates to a method and reactor for applying a coating to a fiber by chemical vapor deposition (CVD).

Fiber reinforced ceramic matrix composites (CMCs) are formed of continuous uniaxial or woven fibers of ceramic material embedded in a ceramic matrix. These materials are designed to have a weak fiber-matrix bond strength. When a CMC is loaded above a stress that initiates cracks in the matrix, the fibers debond from the matrix allowing fiber/matrix sliding without fiber fracture. The fibers bridge the matrix crack and transfer load to the surrounding matrix by transferring tensile stress to frictional interfacial shear force.

Conventional manufacturing processes for CMCs have comprised, first, preparing a flowable suspension of the ceramic matrix material in powdered form, coating or immersing the inorganic fibers (usually long fiber tows) with the suspension, and collecting the coated fiber tows into a mat or other shape. The impregnated fibers and shapes made therefrom are at this stage of the process commonly termed "prepreg." The prepreg can be reshaped as desired but is ultimately formed into a preform for the desired composite article. The preform is then subjected to a burn-out step wherein organic or other fugitive components present in the coating are removed from the preform. The debindered preform is finally consolidated into a dense composite material by reaction with molten silicon at high temperature.

Preferred fibers for producing CMCs are of relatively small diameter (8–15 microns). The fibers are wrapped in tows of several hundred individual filaments. The coating is applied to the fibers for several purposes such as to protect them during composite processing, to modify fiber-matrix interface stresses and to promote or prevent mechanical and/or chemical bonding of the fiber and matrix. Chemical vapor deposition (CVD) is a preferred technique for production of coatings on fibers used for production of ceramic matrix composites.

The coating process must uniformly coat all fibers. While this is possible when the fibers are individual filaments, it is very difficult to achieve when the fibers are collected into tows and woven, braided or knitted into fabrics. Adjacent and neighboring fibers block the flow of gaseous coating reactant to the fiber surfaces and block counterflow of reaction by-product gases away from the fibers. There is a need for an improved CVD process and reactor for uniformly coating CMC fibers.

BRIEF SUMMARY OF THE INVENTION

The invention provides a method and reactor that improves the uniform coating of CMC fibers. According to the invention, a method of coating a CMC fiber comprises passing the fiber through a reactor zone along a path substantially parallel to a longitudinal axis of the zone and passing a flow of fiber coating reactant though the reactor zone. At least a portion of the flow of reactant is disrupted from a path substantially parallel to the fiber path to create a mixing flow adjacent the fiber.

A coating reactor comprises a reactor chamber to accommodate a fiber passing along a path substantially parallel to a longitudinal axis of the chamber and a flow of fiber coating reactant. The reactor chamber further comprises a flow disrupter located within the reactor chamber to disrupt at least a portion of the flow of reactant from a path substantially parallel to the fiber path to create a mixing flow adjacent the fiber.

DETAILED DESCRIPTION OF THE INVENTION

Ceramics have excellent heat resistance, corrosion resistance and heat insulating properties in comparison to metal materials. Hence, ceramics can be used as structural materials in place of metals in harsh high temperature or corrosive environments. However, ceramics cannot be deformed in the same way as metal materials. In a ceramic, stress becomes concentrated on defects in the material and flaws on the material surface. Fibers can be dispersed in a matrix of the ceramic to improve its toughness. The present invention generally relates to fibers that are adapted for use as a reinforcement phase in a composite ceramic. The fibers prevent catastrophic failure of a CMC by debonding and bridging cracks as matrix fracture occurs.

Typically, fibers are provided with a continuous coating to control interfacial shear strength between fibers and the ceramic material. The coating can be applied to the fibers by CVD. Typically, a continuous CVD reactor consists of a vertical chamber. Single or multiple fiber tows are passed through the center of the chamber, while a reactant gas is injected at the chamber bottom. Flow of gas in the chamber can be either counter to or in the same direction as movement of the tow and substantially parallel to the tow. According to the invention, the flow of gas is diverted to interrupt this substantially parallel flow. The resulting turbulent mixing flow improves coating of the fiber tows with deposited reactant product. The flow is diverted by a disrupter that can be any structure in the path of reactant gas flow that disorders, agitates or mixes the normal substantial parallel course of reactant gas.

These and other features will become apparent from the drawings and following detailed discussion, which by way of example without limitation describe preferred embodiments of the present invention.

Figure 1:
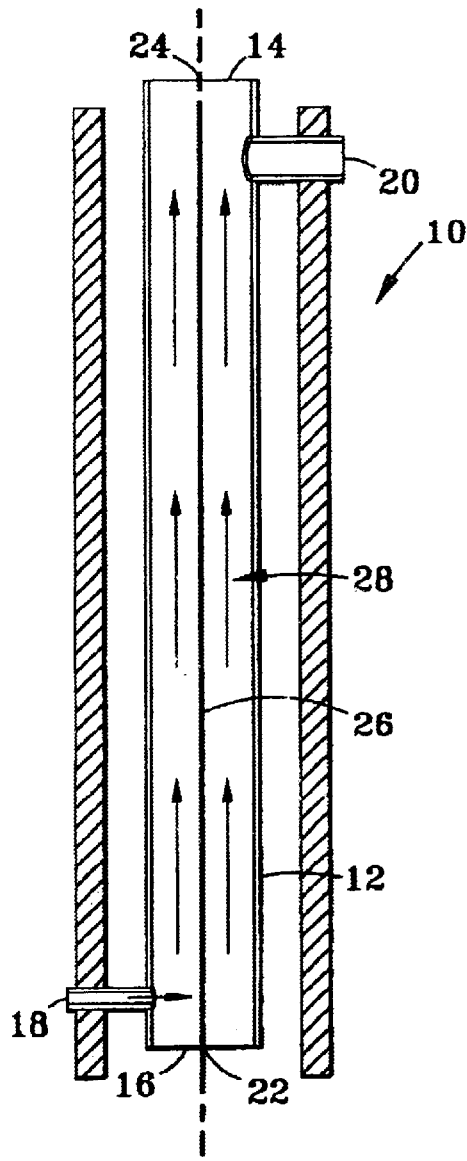
FIG. 1 is a schematic representation of a prior art reactor to coat a CMC fiber.

A schematic cross-section drawing of a reactor 10 for a continuous CVD coating process is shown in FIG. 1. The reactor 10 includes a reactor chamber 12, each end of which is terminated by one of a pair of seals 14 and 16. The reactor chamber 12 has a reactant inlet 18 and an exhaust port 20. A set of fiber apertures 22 and 24 in seals 14 and 16 enable fiber tow 26 to be pulled on-line through the reactor chamber 12 for chemical vapor deposition of a coating.

The reactor chamber 12 is oriented vertically so that weight of the fiber does not produce sag (as it would in a horizontal deposition process), which would tend to bring the fiber into contact with seals 14 and 16 defining apertures 22 and 24. The flow of reactant gas is designated by 28. The reactor chamber 12 is relatively narrow to ensure that reactant gas flow 28 passes through the reactor chamber 12 in close proximity to the fiber tow 26 for effective coating.

In the process, continuous lengths of individual or multiple fiber tows 26 are passed through the reactor chamber 12 at a predetermined speed. Reactant gas flow 30 is passed through the chamber 12 as well, essentially parallel and counter to the movement of the fiber tow 26. Decomposition of the reactant results in coating of the fibers of the tow 26. As reactant in an immediate vicinity of the fiber tow is consumed, additional reactant diffuses from a bulk gas phase. At the same time, reaction product diffuses away from the fiber tow 26 to create a gradient of reactant and product.

Figure 2:
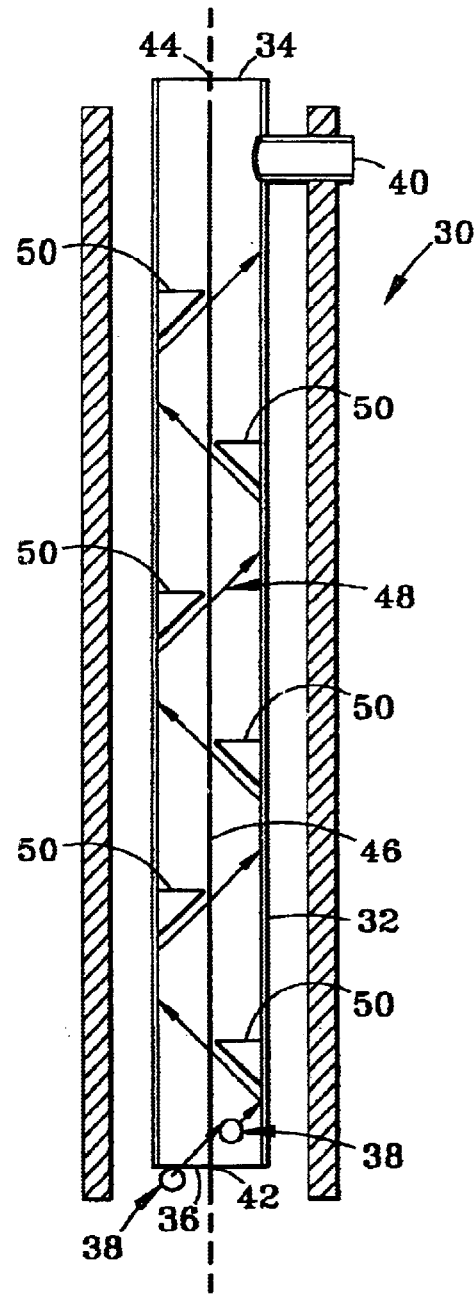
FIG. 2 is a schematic representation of a reactor according to the invention.

FIG. 2 shows a schematic of a reactor according to the invention. In FIG. 2., the reactor 30 includes a reactor chamber 32, each end of which is terminated by one of a pair of seals 34 and 36. The reactor chamber 32 has a reactant inlet 38 and an exhaust port 40. A set of fiber apertures 42 and 44 in seals 34 and 36 enable fiber tow 38 to be pulled on-line through the reactor chamber 32 for chemical vapor deposition of a coating.

Single or multiple fiber tows 38 are passed through the center of chamber 32, while reactant gas is injected at the bottom of the chamber 32. In accordance with the invention, chamber 32 is equipped with a set of gas flow disrupters 50 positioned along its length. Flow of gas in the chamber is designated 48. The disrupters 50 force gas to flow 48 though the reactor chamber in a convoluted or turbulent pathway, rather than parallel to the tube axis. In FIG. 2, gas flow disrupters 50 have deflecting faces 52 shown set at an angle of 45° to the furnace axis, thus causing gas to change direction of travel by 90° at each disrupter. The angle at which the gas is directed toward the fiber tow can have any value from a few degrees to about 90°. Desirably the angle of the disrupter face to the furnace axis is about 10° to about 80°, preferably about 20° to about 50°.

Figure 3:
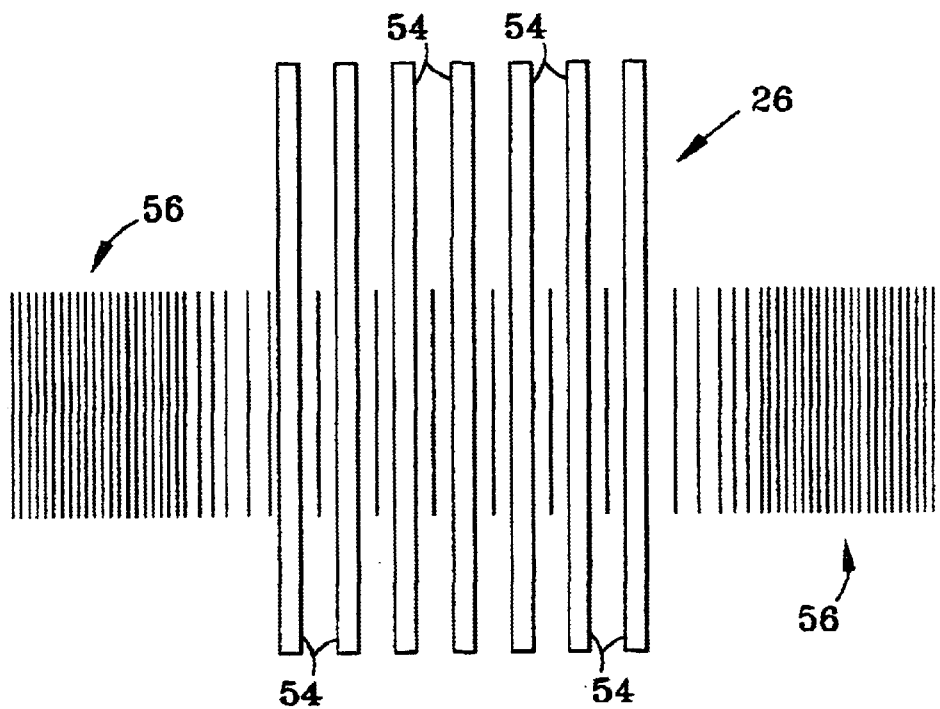
FIG. 3 is a schematic representation of reactant gas concentrations.

The disrupted flow pattern causes gas to flow directly through the fiber tow. For example, FIG. 3 is a schematic representation of a flow gradient in a standard reactor. In FIG. 3, individual fibers 54 of tow 26 are represented as vertical parallel lines. Reactant gas flow 28 on either side of tow 26 is represented by vertical parallel lines 56. Density of the lines 56 represents gas concentration in the vicinity of fiber tow 26. Increased line 56 density indicates increased gas concentration. FIG. 3 shows a lessened gas concentration in the near vicinity of the tow 26.

Figure 4:
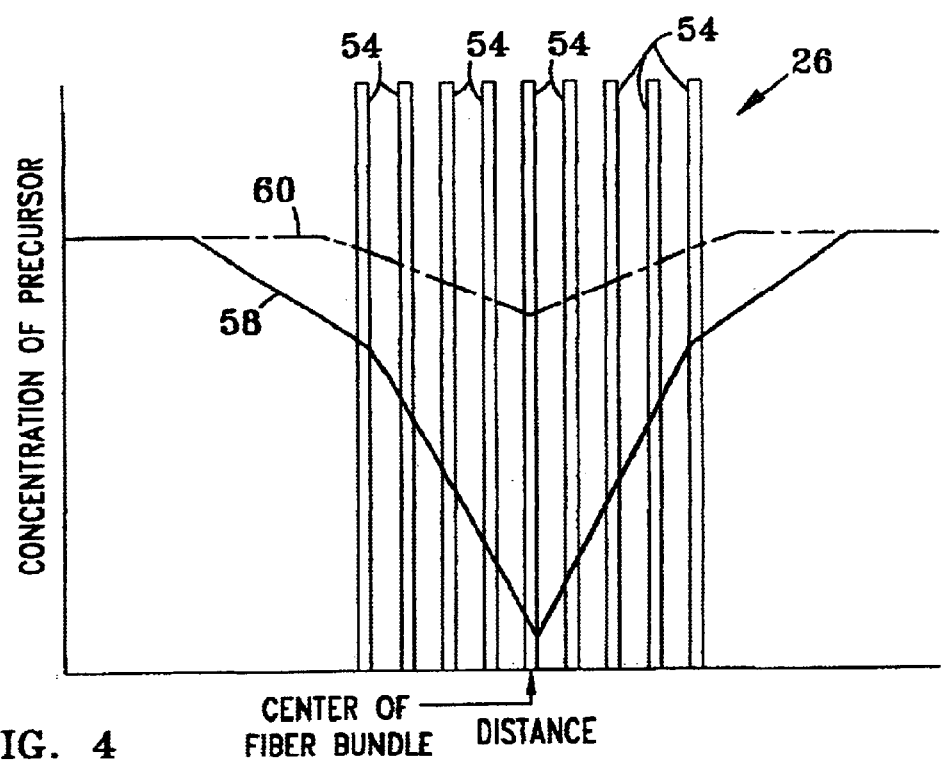
FIG. 4 is a plot of gas concentration against distance from a fiber.

FIG. 4 is a plot of gas concentration in the vicinity of the tow 26. FIG. 4 plots concentration of reactant gas against distance from vicinity on one side, through the center of the tow to a distance to a vicinity on another side. The plot shows two different cases of flow conditions. A first case represents a concentration of substantially parallel flow reactants that are characterized with a low degree of mixing. The second case 58 represents concentration of reactants in a method or system according to the invention. In the second case 60, disrupters have caused the gas to flow 48 though the reactor chamber 12 in a convoluted or turbulent pathway. The second case reactants are characterized by a high degree of forced cross flow. The cross flow pattern results in higher mixing of reactants. FIG. 4 shows that reactant concentration in a parallel flow condition decreases farther from the fiber tow 26. Diffusion of gas toward the fiber is slower than with the high mixing case as represented by second case reactant line 60.

Additionally, FIG. 4 shows that the parallel flow 58 concentration gradient inside the bundle abruptly diminishes. Fibers 54 on the outside of the tow 26 receive a much thicker coating than fibers within the interior of the tow 26. In contrast, the concentration of disrupted flow 60 only gradually diminishes. Disrupted flow 60 delivers a substantially improved uniformity of coating from exterior to interior of a tow 26 as contrasted to parallel flow 58.

This disrupted flow 60 provides several advantages.

First, the pattern results in an improved uniform coating thickness. As reactants are consumed by reaction, new reactants are supplied by diffusion through the relatively stagnant boundary layer immediately adjacent the fiber tow. In a parallel gas flow, a concentration gradient is formed around the fiber tow as reactants are consumed by reaction. By the invention, gas is forced to flow at an angle to the fiber tow, causing increased turbulence that diminishes the thickness of the boundary layer. A thinner boundary layer presents less of a static area to stifle mixing of reactants and increased area of turbulent flow that improves mixing of reactants. The increased area of turbulent mixing results in a uniformity improvement in the coating, which is the product of the improved mixed reactants.

Second, substantially parallel flow of a conventional process causes a large fraction of reactant gas to pass through the chamber without ever coming into contact with fiber. The inventive turbulent flow causes an increased mixing of the gas that results in an increased contact and an increased fractional deposition of reactant gas onto fiber. Material transport between the bulk of the flowing reactant gas and gas in an immediate vicinity of fiber is increased because of shorter diffusion distance. These effects result in a faster coating rate and a more efficient utilization of reactant gas.

Third, the pattern results in faster gas heating. Injected gas is heated by contact with the hot surface of the reactor chamber wall. Little heating occurs through radiation. The pattern of disrupted gas flow of the invention results in a considerably longer gas path along chamber surface. Additionally, each change in direction of the gas path caused by disrupters brings the gas into close intimate contact with the chamber surface. Both the longer path and closer wall contact serve to improve heating of the gas.

Figure 5:
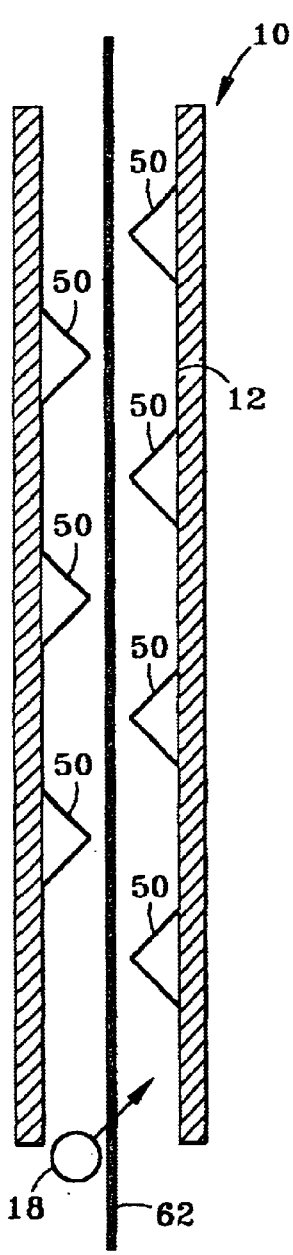
FIGS. 5 to 9 are schematic representations of various disrupter configurations.
Figure 6:
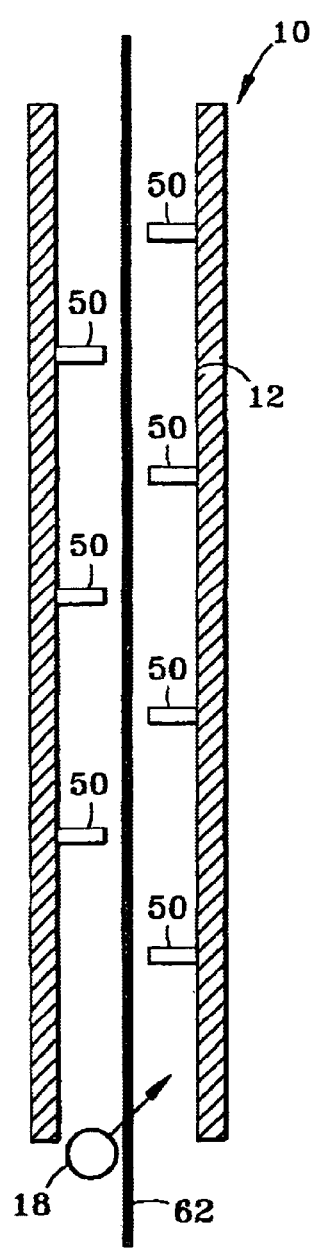
Figure 7:
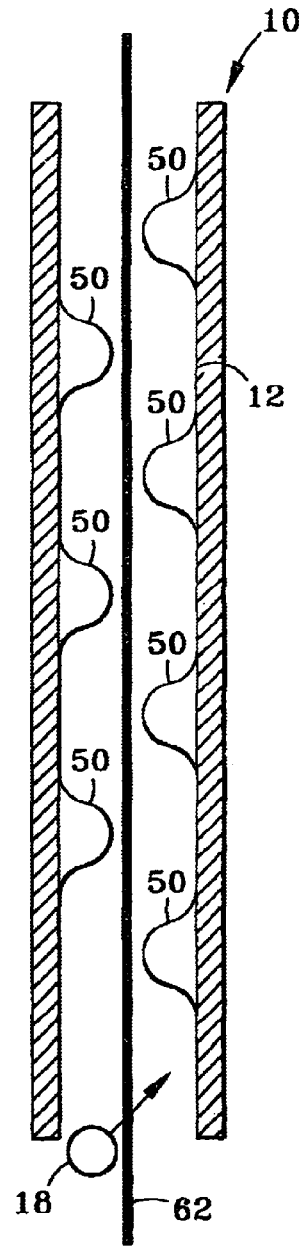

FIGS. 5, 6 and 7 depict various embodiments of disrupter configurations according to the invention. FIG. 7 shows a disrupter with both leading and trailing faces that impart a slightly different turbulence to the gas flow than the disrupters of FIG. 2. FIG. 6 shows disrupters with 90° faces in the reactant gas flow direction.

Figure 8:
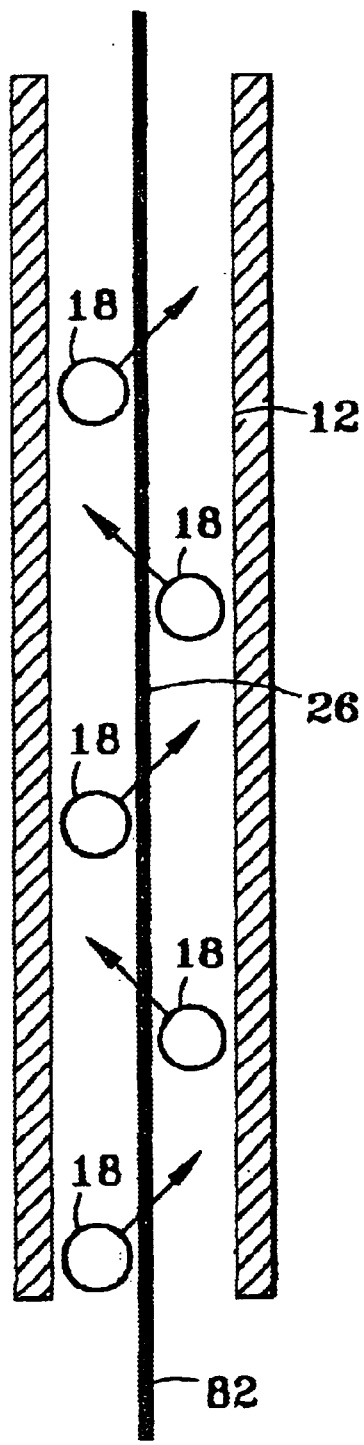

In FIG. 8, a chamber 12 is provided that has a plurality of reactant injection inlets 18 intermittently spaced along the longitudinal axis 62 of the chamber. The inlets 18 are directed into the chamber at an angle to the fiber tow 26 to create a turbulent mixing flow adjacent the tow 26. The inlets 18 are offset from each other along the longitudinal axis 62. In this embodiment, mixing and the consequential gas/fiber interaction can be varied by varying the angle reactant injection.

Figure 9:
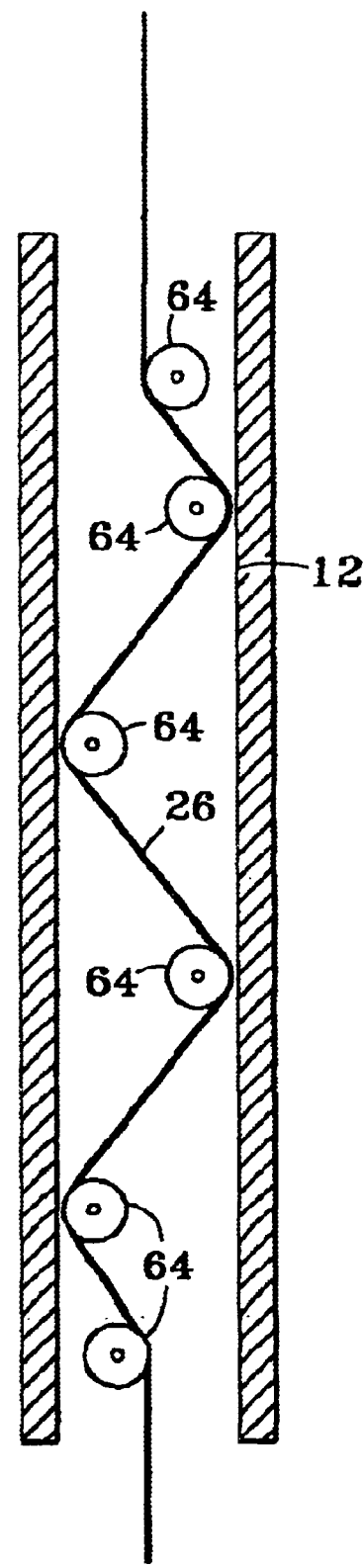

FIG. 9 shows a chamber 12 comprising a set of rollers 64 that convey the fiber tow 26 repeatedly back and forth across the reactor longitudinal axis 62 to interact with the reactant gas flow 48.

The invention can be used to coat any type of fiber, such as monofilament fiber or a fiber tow. Silicon carbide fiber, designated as SCS-6, manufactured by Textron Co., with a diameter of 142 microns, is an example of a suitable monofilament fiber. Single crystal aluminum oxide fiber, manufactured by Saphicon Corp., with a diameter of 250 microns, is another example of a suitable monofilament fiber.

Fibers that are available in tows tend to be smaller in diameter than the suitable monofilament fibers. The fiber of a tow can have a diameter of 4–25 microns. A fiber tow can contain from 50 to 12000 fibers, depending on fiber type, size and intended use. Numerous fibers are available in the form of a tow. These fibers range in composition from glasses to polycrystalline materials. Suitable fibers include oxide, silicon carbide and silicon nitride types. Other suitable types include glass fibers (fiberglass composites) and carbon fibers. Several types of polycrystalline oxide fibers are suitable and are available, for example as the Nextel® ceramic fiber family produced by 3M Co.

Silicon carbide fibers are produced by spinning fibers from a polymer precursor, curing and converting the fibers to nearly pure silicon carbide by subsequent heat treatment. Commercially available silicon carbide fibers typically range in size from about 8 to 14 microns and are available in tows containing from 400 to 800 fibers. The silicon carbide-based fibers are of particular interest for composites described in present invention. However, the invention can be used to coat any fiber.

The coating method of the invention can be a continuous coating process. In the continuous process, fibers are passed through a furnace, which is held at an elevated temperature. A constant flow of precursor gas is maintained through the furnace. Gas decomposes at about 700° to about 1800° C. temperature and reacts and deposits to form a coating on the fiber. Desirably, the temperature is about 1100° to about 1550° C. and preferably about 1350° to about 1500° C. A gaseous by-product is formed that is swept out of the furnace.

The number of fiber tows being coated simultaneously varies with the size of the CVD chamber. For example, a typical furnace can accommodate from one to about 25 fiber tows. Internal tow fiber spacing can be about 0.020 to about 1 inch, desirably about 0.045 to about 0.25 and preferably about 0.05 to about 0.1 inch.

The speed at which fibers are transported through the furnace is dependent on the type of coating being applied, desired thickness and the length of deposition zone in the furnace. A typical rate can be from about 1 to about 200 inches/minute. A desired rate is from about 5 to about 100 inch/minute and a preferred range is from about 10 to about 60 inches/minute.

The reactant gases that are used are determined by the desired coating. Some coatings are produced by decomposition of a single reactant gas. For example, deposition of carbon is typically accomplished by decomposition of a hydrocarbon, such as methane. The decomposition reaction can be described by the following:

$$CH_4 \rightarrow C + 2H_2$$

A two-gas reaction can be used for other coatings, such a boron trichloride and ammonia reaction to form boron nitride or a three gas reaction, such as a boron trichloride, ammonia and a silicon precursor reaction. Silicon precursors include dichlorosilanne, trichlorosilane, silicon tetrachloride and silane. Hydrogen or nitrogen, which may not be directly involved in the chemical deposition reaction can be used to dilute precursor gases to control reaction speed and temperature.

The thickness of coating deposited on a fiber is dependent on a number of factors such as fiber speed, reactor pressure and precursor gas flow rate. The gas flow rate has to be sufficient to provide desired coating thickness on the fiber. The rate depends on the cross section of the reactor, number of fibers being coated and their transport rate. The rate can vary from 0.1 to 100 standard liters per minute (slpm). Standard liters per minute means that the gas flow rate is referenced to a measurement made at standard conditions (pressure of 1 atmosphere, temperature of 298° K). This convention is necessary because gas volume changes with pressure and temperature. For a specific reactor having a cross section of about 30 cm², a gas flow rate can be about 0.5 to about 20 slpm, desirably 1 to about 10 slpm and preferably about 2 to about 5 slpm.

Reactor pressure determines how fast the precursor gas decomposes. It also has an effect on the mean free path of gas molecules, so it may affect fiber coating thickness uniformity. Operation at a reduced pressure (below atmospheric) is preferred, although not required. Typically, deposition rates decrease with pressure; however, coating thickness tends to be more uniform through a tow or bundle. Reactor pressure can be from about 0.05 Torr to atmospheric pressure (760 Torr). Desirably, the pressure for the process is about 0.1 to about 50 Torr and preferably about 0.3 to about 10 Torr.

The following Examples are illustrative and should not be construed as a limitation on the scope of the claims unless a limitation is specifically recited.

EXAMPLES

Several bundles of Nicalon, a silicon carbide fiber from Nippon Carbon Company, were wound on a spool and installed into a spool box on one end of a CVD reactor. The fibers were passed through the CVD reactor as an array of bundles and were attached to a pick up spool in a receiving box on the opposite end of CVD reactor. End boxes were connected to the reactor chamber by narrow slits, just large enough to pass the fiber bundle. The deposition chamber was a graphite tube of uniform cross section, with flow disrupters installed along its length. The chamber had a total of six disrupters in the form of ⅝-inch long wedges attached alternately to opposite sides of the chamber wall as shown in FIG. 2.

The reactor was evacuated and a flow of nitrogen gas was introduced into the reactor chamber through each end box as a seal against reactant leakage. The reactor chamber was heated to 1450° C. Reactant gases, boron trichloride and ammonia, were injected into the bottom of the reactor chamber for flow through the chamber in the same direction as the fiber bundle. A vacuum pumping system at the top of the chamber expelled spent gas.

Reactant gases were passed at a constant flow rate while the fiber bundle was transported through the chamber in the same direction at constant speed. Boron trichloride and ammonia reacted to form boron nitride, which deposited on the fiber (and on furnace wall). Once an entire length of the fiber bundle was coated, gas flow was stopped and equipment was cooled to room temperature, still under vacuum.

Coated fibers were examined in a scanning electron microscope. The coating thickness of the fibers on the periphery of the fiber bundle was compared to coating thickness on the fibers in the center of the fiber bundle. It was found that average coating thickness of fibers at the periphery was about a factor of two greater than the coating thickness in the center of the bundle.

For comparison, a fiber bundle was coated in a reactor without flow disrupters and was analyzed in the same fashion as the disrupted flow product. It was found that average coating thickness of fibers on the bundle perimeter was about factor of 8 thicker than the coating of fibers in the center of the bundle. The result shows that introduction of the flow disrupters into the reactor resulted in much more uniform fiber coating thickness.

While preferred embodiments of the invention have been described, the present invention is capable of variation and modification and therefore should not be limited to the precise details of the Examples. The invention includes changes and alterations that fall within the purview of the following claims.

What is claimed is:

1. A coating reactor, comprising:
   a reactor chamber to accommodate a fiber passing along a path substantially parallel to a longitudinal axis of said chamber and a flow of fiber coating reactant; and
   a plurality of flow disrupters located within said reactor chamber to disrupt at least a portion of said flow of reactant from a path substantially parallel to said fiber path to create a mixing flow adjacent said fiber, each of said flow disrupters covering a portion of a circumference of said reactor chamber;
   wherein said path of said fiber is unobstructed by said flow disrupters, and each of said disrupters comprises a first face disposed to form a first angle with said longitudinal axis, a second face disposed to form a second angle with said longitudinal axis, and said first face and said second face together form a third angle.

* * * * *